United States Patent
Moore et al.

(10) Patent No.: US 11,850,874 B2
(45) Date of Patent: Dec. 26, 2023

(54) MICRO-TRANSFER PRINTING STAMPS AND COMPONENTS

(71) Applicant: X Display Company Technology Limited, Dublin (IE)

(72) Inventors: Tanya Yvette Moore, Hurdle Mills, NC (US); David Gomez, Holly Springs, NC (US); Christopher Andrew Bower, Raleigh, NC (US); Matthew Alexander Meitl, Durham, NC (US); Salvatore Bonafede, Chapel Hill, NC (US)

(73) Assignee: X Display Company Technology Limited, Dublin (IE)

( * ) Notice: Subject to any disclaimer, the term of this patent is extended or adjusted under 35 U.S.C. 154(b) by 235 days.

(21) Appl. No.: 16/835,159

(22) Filed: Mar. 30, 2020

(65) Prior Publication Data
US 2021/0300098 A1    Sep. 30, 2021

(51) Int. Cl.
| | |
|---|---|
| *B41K 3/04* | (2006.01) |
| *G03F 7/00* | (2006.01) |
| *B41F 16/00* | (2006.01) |

(52) U.S. Cl.
CPC ............... *B41K 3/04* (2013.01); *B41F 16/00* (2013.01); *G03F 7/0002* (2013.01)

(58) Field of Classification Search
CPC ....... H01L 2221/68368; H01L 25/0753; H01L 21/6835; G03F 7/0002; B41F 16/00; B41K 3/04
See application file for complete search history.

(56) References Cited

U.S. PATENT DOCUMENTS

| | | | | |
|---|---|---|---|---|
| 7,622,367 | B1 * | 11/2009 | Nuzzo | H01L 24/03 438/106 |
| 7,943,491 | B2 | 5/2011 | Nuzzo et al. | |
| 8,039,847 | B2 | 10/2011 | Nuzzo et al. | |
| 8,506,867 | B2 * | 8/2013 | Menard | H01L 24/75 264/293 |
| 8,722,458 | B2 | 5/2014 | Rogers et al. | |
| 8,889,485 | B2 | 11/2014 | Bower | |
| 9,412,727 | B2 | 8/2016 | Menard et al. | |
| 2004/0191700 | A1 * | 9/2004 | Kuwabara | B82Y 40/00 430/320 |
| 2012/0313241 | A1 * | 12/2012 | Bower | H01L 24/13 257/737 |
| 2016/0020131 | A1 * | 1/2016 | Bower | H01L 24/83 294/213 |
| 2017/0047306 | A1 * | 2/2017 | Meitl | H01L 21/6835 |
| 2017/0173852 | A1 | 6/2017 | Moore et al. | |
| 2017/0207193 | A1 * | 7/2017 | Bower | B41F 16/0073 |
| 2019/0189496 | A1 * | 6/2019 | Chen | H01L 21/6835 |
| 2021/0039380 | A1 | 2/2021 | Cok | |

\* cited by examiner

*Primary Examiner* — David H Banh
(74) *Attorney, Agent, or Firm* — Choate, Hall & Stewart LLP; William R. Haulbrook; Michael D. Schmitt

(57) ABSTRACT

A micro-transfer structure comprises a stamp comprising a rigid support, only a single contiguous bulk layer disposed on the rigid support, and posts disposed on the bulk layer. Components are adhered to (e.g., disposed in contact with) some but not all of the posts. The posts can be substantially identical and disposed in a regular array on the bulk layer. Each component is adhered to (e.g., in contact with) two or more posts. Components can be disposed on a source wafer entirely over sacrificial portions of a sacrificial layer on or in the source wafer and attached to anchors disposed between sacrificial portions with a tether.

38 Claims, 11 Drawing Sheets

MICRO-TRANSFER PRINTING STAMPS AND COMPONENTS

TECHNICAL FIELD

The present disclosure generally relates to micro-transfer printing stamps and micro-transfer printable components.

BACKGROUND

Substrates with electronically active components distributed over the extent of the substrate are used in a variety of electronic systems, for example, in flat-panel display components such as flat-panel liquid crystal or organic light emitting diode (OLED) displays, in imaging sensors, and in flat-panel solar cells. The electronically active components are typically either assembled on the substrate, for example using individually packaged surface-mount integrated-circuit components and pick-and-place tools, or by coating a layer of semiconductor material on the substrate and then photolithographically processing the semiconductor material to form thin-film circuits on the substrate. Individually packaged integrated-circuit components typically have smaller transistors with higher performance than thin-film circuits but the packages are larger than can be desired for highly integrated systems.

Methods for transferring small, active components from one substrate to another are described in U.S. Pat. Nos. 7,943,491, 8,039,847, and 7,622,367. In some such approaches, small integrated circuits are formed on a native semiconductor source wafer. The small, unpackaged integrated circuits, or chiplets, are released from the native source wafer by pattern-wise etching portions of a sacrificial layer located beneath the chiplets, leaving each chiplet suspended over an etched sacrificial layer portion by a tether physically connecting the chiplet to an anchor separating the etched sacrificial layer portions. A viscoelastic stamp is pressed against the process side of the chiplets on the native source wafer, adhering each chiplet to an individual stamp post. The stamp with the adhered chiplets is removed from the native source wafer. The chiplets on the stamp posts are then pressed against a non-native target substrate or backplane with the stamp and adhered to the target substrate.

In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane. Such micro-transferred components provide the high performance of crystalline semiconductor components together with the small size of unpackaged dies.

Micro-transfer printing stamps are an important part of any micro-transfer printing system and method. There is an ongoing need, therefore, for stamp structures that are highly reliable and easy-to-use for a variety of component micro-transfer printing processes.

SUMMARY

The present disclosure provides, inter alia, structures and methods for more efficiently micro-transfer printing components from a source wafer to a target substrate. According to some embodiments of the present disclosure, a micro-transfer structure comprises a stamp comprising a rigid support, a bulk layer disposed on the rigid support, and posts disposed on the bulk layer. The bulk layer can be, for example, only a single contiguous bulk layer and, for example, having a contiguous planar surface opposite the rigid support. Components are adhered to (e.g., disposed in contact with) some but not all of the posts. The posts can be, but are not necessarily, substantially identical and can be, but are not necessarily, disposed in a regular array on the bulk layer. Each component is adhered to (e.g., in contact with) two or more posts. Each post can have (i) a substantially planar distal end, (ii) a contiguous distal end, or (iii) both (i) and (ii). In some embodiments, at least some posts are not in contact with any component. The bulk layer, the posts, or both the bulk layer and the posts can be elastomeric (e.g., comprise or consist essentially of polydimethylsiloxane).

According to some embodiments of the present disclosure, a micro-transfer structure comprises a stamp comprising a rigid support and posts disposed on or over the rigid support and components adhered to (e.g., disposed in contact with) some but not all of the posts. Each component is adhered to (e.g., in contact with) two or more posts and at least some posts are not adhered to (e.g., in contact with) a component. A single contiguous bulk layer can be disposed on the rigid support and the posts can be disposed on the bulk layer. The bulk layer can be more flexible than the rigid support and as flexible as, or less flexible than, the posts.

According to some embodiments, the bulk layer comprises a common layer disposed on the rigid support and one or more pedestals disposed on the common layer on a side of the common layer opposite the rigid support, wherein two or more posts are disposed on each pedestal of the one or more pedestals. The pedestal can be at least as flexible as, or more flexible than, the common layer and the posts can be as flexible as or more flexible than the pedestal, the common layer, or the bulk layer, and more flexible than the rigid layer.

According to some embodiments of the present disclosure, a micro-transfer structure comprises a component source substrate and the components are disposed on the component source substrate. According to some embodiments of the present disclosure, a micro-transfer structure comprises a motion platform and the component source substrate is in contact with, and the component source substrate's position controlled by, the motion platform. According to some embodiments of the present disclosure, a micro-transfer structure comprises a target substrate and the components are disposed on the target substrate. According to some embodiments of the present disclosure, a micro-transfer structure comprises a motion platform and the target substrate is in contact with, and the target substrate's position controlled by, the motion platform. According to some embodiments of the present disclosure, a micro-transfer structure comprises a motion platform and the rigid support of the stamp is in contact with, and the rigid support's position controlled by, the motion platform.

According to some embodiments, each component is adhered to (e.g., in contact with at least two, four, six, ten, twelve, or fifteen posts. The posts can be arranged in rows and columns, each component can have an edge or side, and the edge or side can be aligned with a row or column or with both a row and a column.

According to some embodiments of the present disclosure, the stamp is a first stamp, the rigid support is a first rigid support, the posts are first posts, each of the components has a first side opposite a second side, and the first posts of the first stamp are adhered to (e.g., in contact with)) the first side of the component. Micro-transfer structures of the present disclosure can comprise a second stamp, the second stamp comprising a second rigid support different from the first rigid support, a bulk layer different from the first bulk layer disposed on the second rigid support, for example only a single second contiguous elastomeric bulk layer, and second posts different from the first posts disposed on the second bulk layer. In some embodiments, each second post is adhered to (e.g., in contact with) the second rigid support and no second bulk layer is present. The second sides of the components can be adhered to the second posts of the second stamp. Each component can be disposed in contact with and adhered to fewer second posts on the second side of the component than first posts of the first stamp on the first side of the component. In some embodiments, (i) only one second post is adhered to each component, (ii) more than one second post is adhered to each component, (iii) not all of the second posts are adhered to each component, (iv) both (i) and (iii), or (v) both (ii) and (iii).

Each first post can have a distal end with a first post area, each second post of the second posts can have a distal end with a second post area, and the second post area can be greater than the first post area. The sum of the first post areas in contact with each of the components can be smaller than the sum of the second post areas in contact with each of the components. The second posts can be more adhesive than the first posts. Each post can have a distal end with a post area, each component can have a component area, for example on a process side of the component, and the post area can be less than one half of the component area.

Micro-transfer structures of the present disclosure can comprise a motion platform and the first rigid support can be in contact with and controlled by the motion platform and the second rigid support can be in contact with and controlled by the motion platform.

Methods of the present disclosure can comprise providing a source wafer with components disposed in, on, or over the source wafer, providing a stamp comprising a rigid support and posts disposed on or over the rigid substrate. Methods can comprise disposing the posts in contact with the components so that two or more of the posts are in contact with each component to adhere the components to the posts and removing the stamp with the components from the source substrate. In some embodiments, at least one post is not in contact with a component.

Methods of the present disclosure can comprise providing a source wafer with components disposed in, on, or over the source wafer, providing a stamp comprising a rigid support, only a single bulk layer disposed on the rigid support, and posts disposed on the bulk layer. Methods can comprise disposing the posts in contact with the components so that two or more of the posts are in contact with each component to adhere the components to the posts and removing the stamp with the components from the source substrate.

According to some embodiments, the stamp is a first stamp, the rigid support is a first rigid support, the posts are first posts, each of the components has a first side opposite a second side, and the first posts are in contact with the first side. Methods can comprise providing a second stamp, the second stamp comprising a second rigid support different from the first rigid support, only a single second bulk layer different from the first bulk layer disposed on the second rigid support, and second posts different from the first posts disposed on the second bulk layer. In some embodiments, each second post is adhered to (e.g., in contact with) the second rigid support and no second bulk layer is present. The second posts can be adhered to (e.g., disposed in contact with) the second side of the components with fewer of the second posts in contact with the second side of each component than first posts on the first side, thereby adhering the components to the second stamp while the components are adhered to the first stamp. Methods can further comprise removing the first stamp, contacting the components to the target substrate with the second stamp, and removing the second stamp.

Structures and methods described herein enable a release and printing process for micro-transfer printing components from a source wafer to a target substrate.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
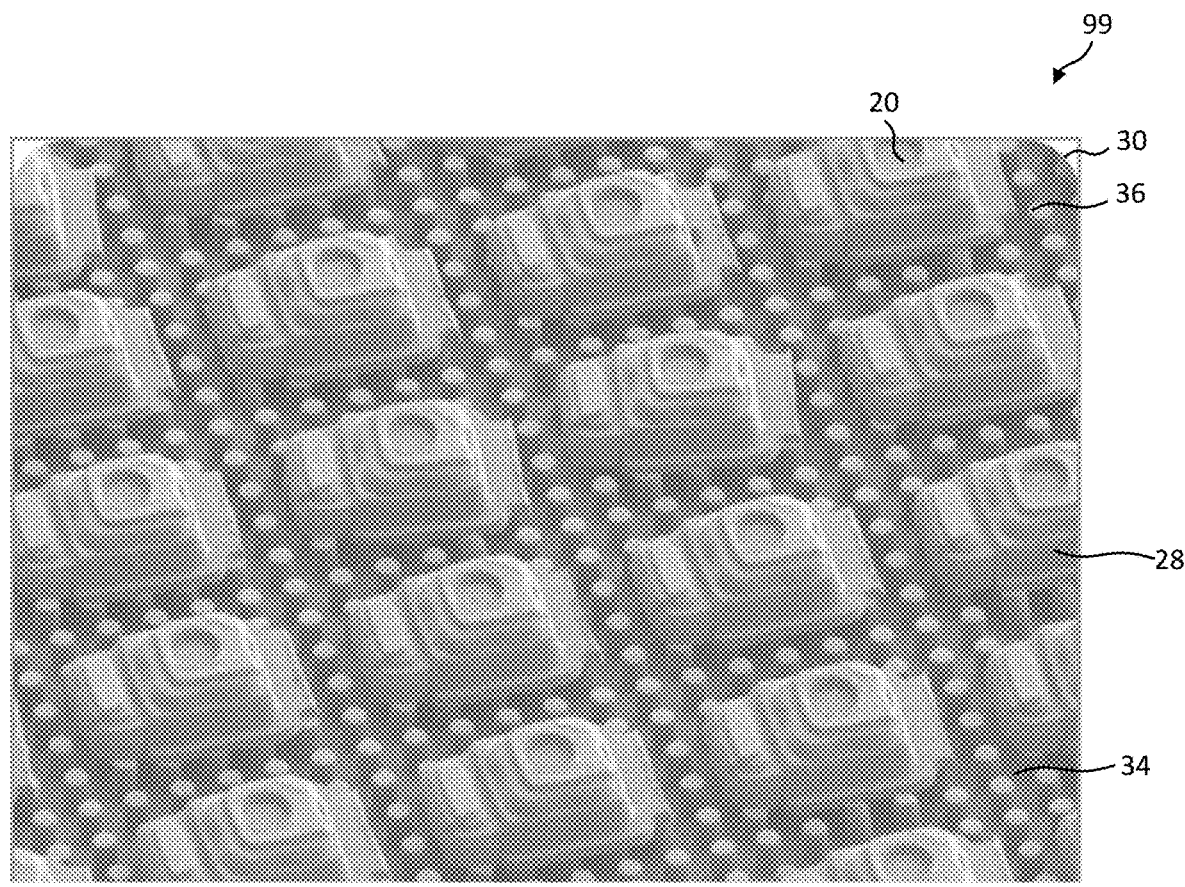
FIG. 1 is a micrograph of a micro-transfer structure according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present disclosure provides, inter alia, a structure and method for micro-transfer printing components from a component source substrate to a target substrate, for example that are in an inverted or flipped configuration. U.S. Pat. No. 8,889,485 entitled Methods for Surface Attachment of Flipped Active Components by Bower describes a process for micro-transfer printing components (for example devices such as semiconductor integrated circuits) in a flipped configuration, as shown in the FIG. 8 flow diagram of the disclosure. As graphically illustrated in FIGS. 3A-3C of the Bower disclosure, components are transferred from a first stamp to a second stamp. In this method, each component is contacted by a single stamp post for both the first and second stamps. The posts of the second stamp have a greater area in contact with the components than the posts of the first stamp (FIGS. 3A, 3B, col. 10 lines 20-30).

According to some embodiments of the present disclosure and as shown in the micrograph of FIG. 1, a micro-transfer structure 99 comprises a stamp 30 comprising a bulk layer 34 and posts 36 disposed on bulk layer 34. Components 20 are disposed in contact with and adhered to some but not all of posts 36. Posts 36 can be substantially identical. Posts 36 can be disposed in a regular array on bulk layer 34. Each component can be in contact with two or more posts 36. For example, as shown in FIG. 1, each component 20 can be in contact with at least four, six, eight, ten, twelve, fifteen, or more posts 36. Posts 36 of stamp 30 can be regularly arranged, for example in rows of posts 36 spaced apart by a same distance, in columns of posts 36 spaced apart by a same distance, or in both rows and columns of posts 36 spaced apart by a same distance. In some embodiments, each component 20 has a component edge or component side 28, and component edge or component side 28 is aligned (e.g., parallel) with a row or column of posts 36 or a first component edge or component side 28 is aligned with a row of posts 36 and a second component edge or component side 28 is aligned with a column of posts 36. As shown in FIG. 1, most of components 20 are aligned with rows and columns of posts 36, but some components 20 are not. According to some embodiments, each post 36 has a distal end with a post area, each component 20 has a component area, and the post area of an individual post 36 in contact with component 20 is less than 50% of the component area, for example less than or equal to 25%, 10%, 5%, or 1% of the component area.

Figure 2:
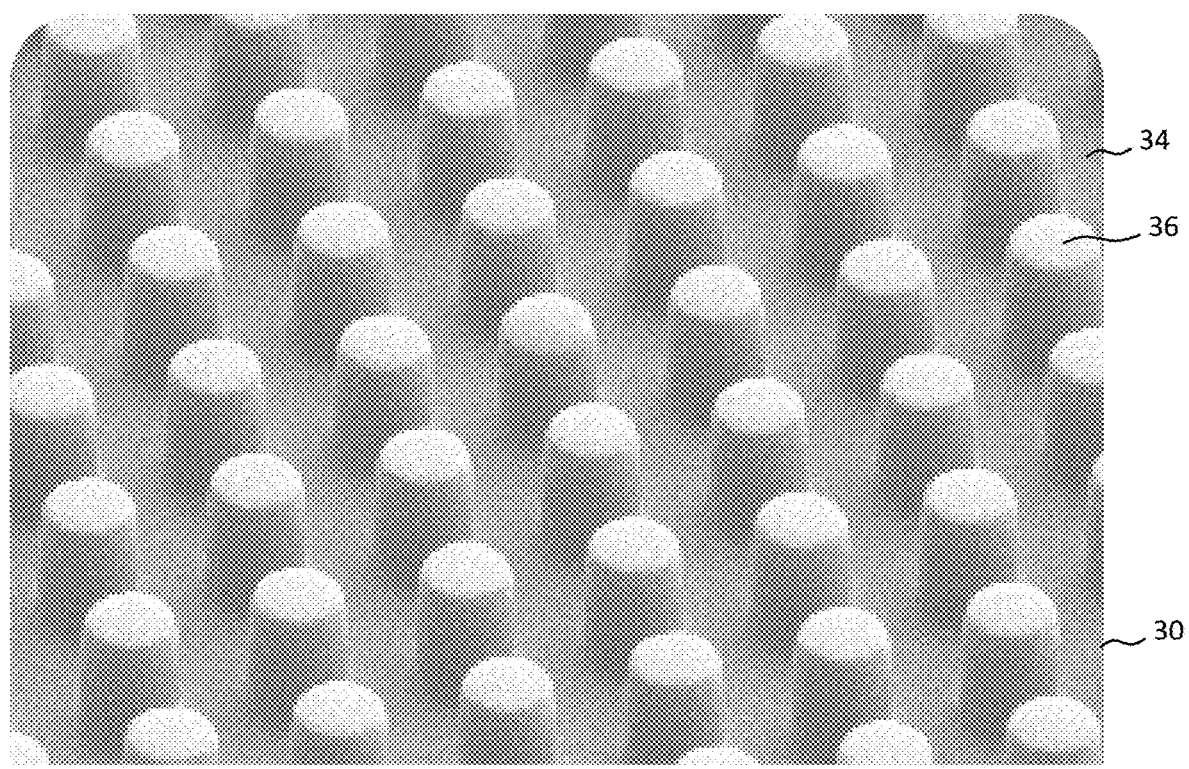
FIG. 2 is a micrograph of a micro-transfer printing stamp according to illustrative embodiments of the present disclosure.
Figure 3:
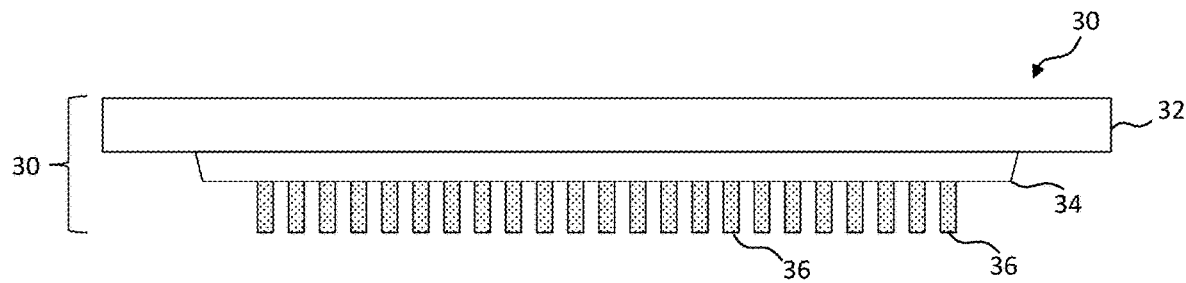
FIG. 3 is a cross section of a stamp according to illustrative embodiments of the present disclosure.
Figure 15:
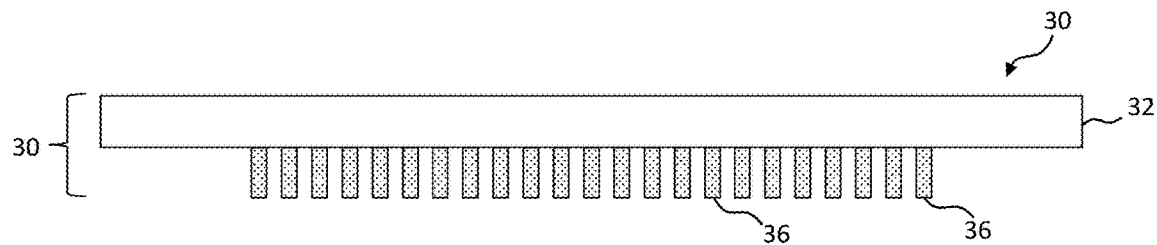
FIG. 15 is a cross section of a stamp according to illustrative embodiments of the present disclosure.

Referring to the micrograph of FIG. 2 and the illustration of FIG. 3, stamp 30 comprises a rigid support 32, only a single, contiguous bulk layer 34 disposed on rigid support 32 (e.g., without any additional mesa or pedestal), and all of posts 36 are disposed on bulk layer 34. In the illustration of FIG. 15, stamp 30 posts 36 are disposed directly on rigid support 32. Stamps 30 can be any visco-elastic material or elastomer, for example polydimethylsiloxane (PDMS), and can be made by casting liquid material on or in a mold, cured, and the mold removed. The mold can be made using photolithographic methods and materials, for example photolithographic processing of a wafer of silicon. A stamp post 36 extends from bulk layer 34 or rigid substrate 32 to a post distal end having a post surface that, for at least some of posts 36, is in at least partial contact with a component 20. The post distal end can be substantially planar, can be contiguous, or can be both planar and contiguous, as shown in FIGS. 1 and 2. A planar post distal end is all in a single plane and a contiguous post distal end is in one connected portion, for example having a perimeter that is a simple closed curve, and not, for example, comprising two separate islands. Bulk layer 34 can comprise a same material as posts 36 and can be equally flexible (e.g., have a common Young's modulus). In some embodiments, bulk layer 34 comprises the same material(s) as posts 36 but in different proportions, so that posts 36 are more flexible than bulk layer 34. In some embodiments, bulk layer 34 comprises different materials than posts 36 and posts 36 are more flexible than bulk layer 34 (e.g., have a lower Young's modulus). Rigid support 32 can be, for example, any suitable wafer or rigid structure with a substantially planar surface suitable for processing, for example glass, silicon, sapphire, or quartz. Rigid support 32 is less flexible than bulk layer 34 and less flexible than posts 36.

Figure 4:
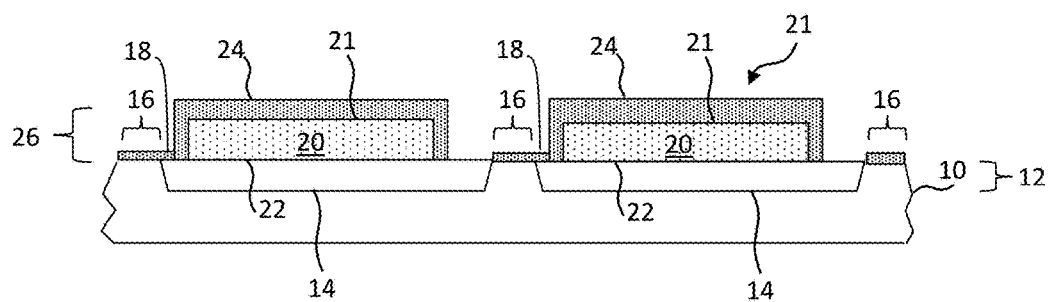
FIG. 4 is a cross section of printable components on a component source wafer according to illustrative embodiments of the present disclosure.

In some embodiments of the present disclosure and as illustrated in FIG. 4, component 20 can be disposed or formed on a substrate 10 (e.g., a component source wafer 10 or a native component source wafer 10) and components 20 are disposed on substrate 10. Source wafer 10 can comprise a sacrificial layer 12 comprising sacrificial portions 14 laterally separated by anchors 16. Components 20 are physically connected to anchors 16 by tethers 18. Each of components 20 can have a first side 21 opposite a second side 22. First side 21 can be on a side of component 20 opposite source wafer 10 and second side 22 can be on an opposite side of component 22 adjacent to source wafer 10. In embodiments, sacrificial portions 14 are sacrificed, for example by dry or wet etching, so that sacrificial material in sacrificial portions 14 is removed to form a gap 15 (as shown in micro-transfer structure 99 of FIG. 6). Component 20 can be encapsulated by encapsulation layer 24 forming component structure 26 to protect components 20 from environmental contaminants. Encapsulation layer 24 can also coat portions of sacrificial layer 12 or source wafer 10 and anchors 16. In some embodiments, tether 18 comprises portions of encapsulation layer 24 or a portion of encapsulation layer 24 forms tether 18, as shown in FIG. 4. Component structure 26 can comprise component 20, encapsulation layer 24 on component 20, and tether 18 or a portion (e.g., fractured or separated portion) of tether 18.

Figure 5:
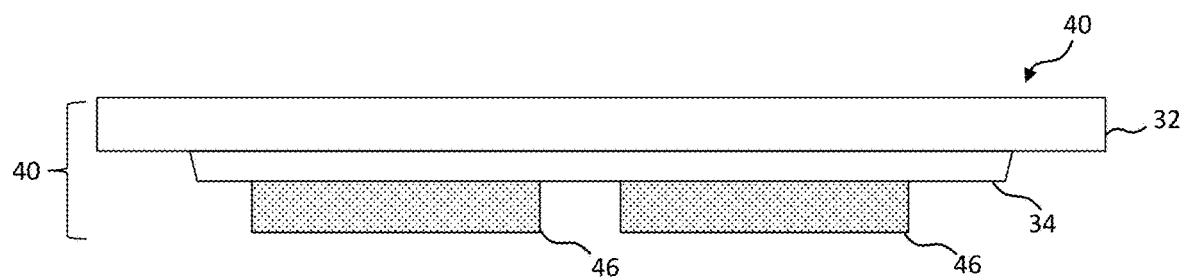
FIG. 5 is a cross section of a second stamp according to illustrative embodiments of the present disclosure.

In some embodiments of the present disclosure, stamp 30 can be a first stamp, rigid support 32 is a first rigid support, and posts 36 are first posts 36. Referring to FIG. 5 and according to some embodiments of the present disclosure, a second stamp 40 comprises a second rigid support 32 different from first rigid support 32, only a single second bulk layer 34 different from first bulk layer 34 disposed on second rigid support 32 (e.g., with no additional pedestal or mesa layer), and second posts 46 different from first posts 36 disposed on second bulk layer 34 (or, in embodiments that do not comprise a second bulk layer 34, second posts 46 are disposed directly on second rigid support 32). Second posts 46 can be larger than and have a larger area on distal ends of second posts 46 than an area of the distal ends of first posts 36, for example an area in contact with components 20. Thus, each first post 36 has a distal end with a first post area, each second post 46 has a distal end with a second post area, and the second post area can be greater than the first post area.

Figure 6:
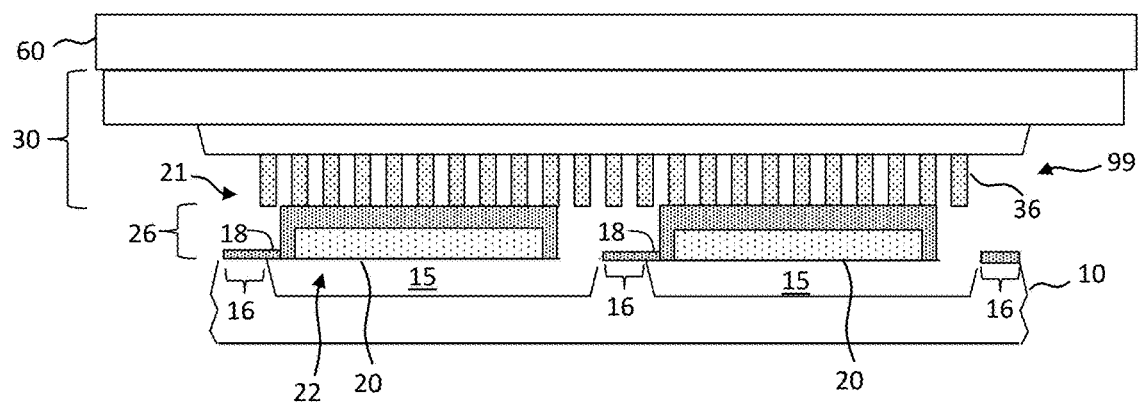
FIG. 6 is a cross section illustrating a first stamp in contact with printable components on a component source wafer according to illustrative embodiments of the present disclosure.

Second stamp 40 can remove components 20 from first stamp 30. As shown in FIG. 6, each component 20 is disposed in contact with and adhered to fewer second posts 46 on second side 22 than first posts 36 on first side 21. In some embodiments of the present disclosure, (i) only one second post 46 is adhered to each component 20 (e.g., as shown in FIG. 6), (ii) more than one second post 46 is adhered to each component 20, (iii) not all of second posts 46 are adhered to the components 20, (iv) both (i) and (iii), or (v) both (ii) and (iii). Thus, where more than one second post 46 is adhered to each component 20 some of second posts 46 are not necessarily adhered to any component 20, for example as with first posts 36 in FIGS. 1 and 6, although second posts 46 are larger than or have more area at distal ends of second posts 46 in contact with a component 20 than first posts 36 have in contact with component 20.

In some embodiments, all second posts 46 are in contact with a component 20. According to some embodiments, the sum of the first post areas in contact with a component 20 is smaller than the sum of second post areas in contact with a component (even if only a single second post 46 is in contact with component 20). Thus, if first and second posts 36, 46 adhere to a component 20 with an equal strength per contact area, components 20 will preferentially adhere to second stamp 40 because second stamp has a greater total second post area in contact with components 20 than the total first post contact area of first stamp 30 and therefore a greater adhesion and, when first and second stamps 30, 40 are removed from each other, components 20 will adhere to second stamp 40 in preference to first stamp 30.

In some embodiments of the present disclosure, second posts 46 comprise different materials or different mixtures of materials than first posts 36, so that second posts 46 are more adhesive than first posts 36 and components 20 can preferentially adhere with more strength to second posts 46 than to first posts 36.

The positions and movements of first and second stamps 30, 40 and substrate 10 can be controlled by a motion platform 60 (e.g., a 2D or 3D motion platform 60). For example, first rigid support 32 of first stamp 30 and second rigid support 32 of second stamp 40 can be in contact with, and their movements controlled by, the motion platform 60. A motion platform 60 can be a mechatronic system that uses an optical camera to align stamp 30 to components 20.

Figure 7:
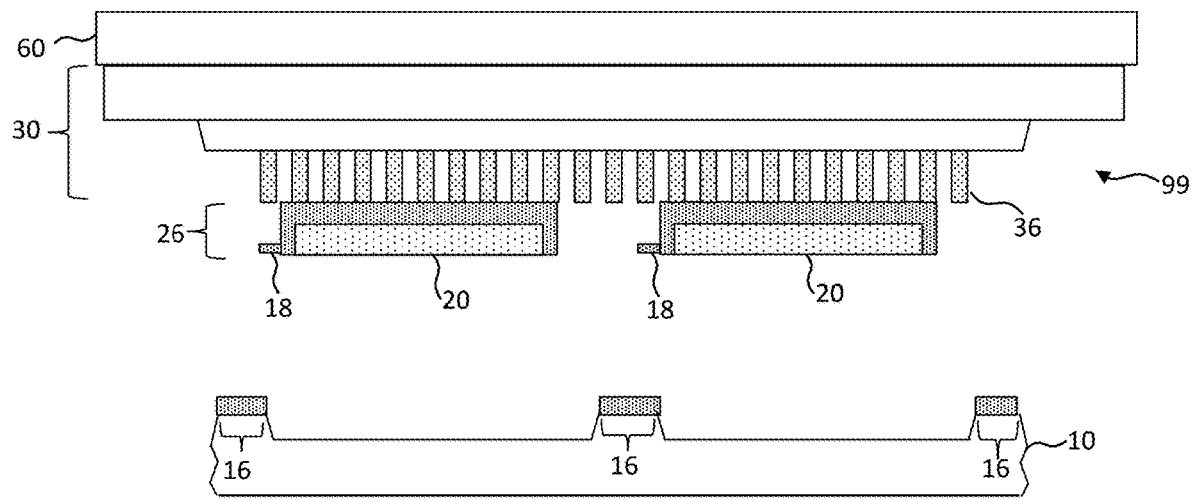
FIG. 7 is a cross section illustrating a first stamp with printable components removed from a component source wafer according to illustrative embodiments of the present disclosure.
Figure 8:
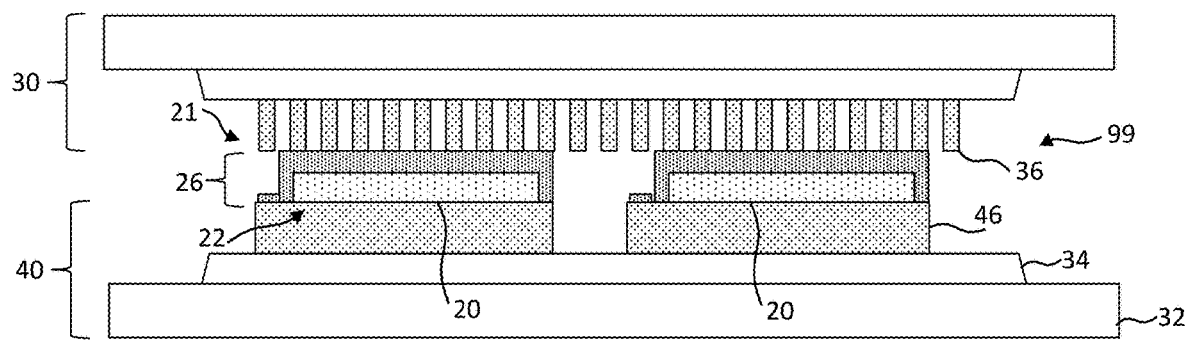
FIG. 8 is a cross section illustrating a stamp-to-stamp transfer of components from a first stamp to a second stamp according to illustrative embodiments of the present disclosure.
Figure 9:
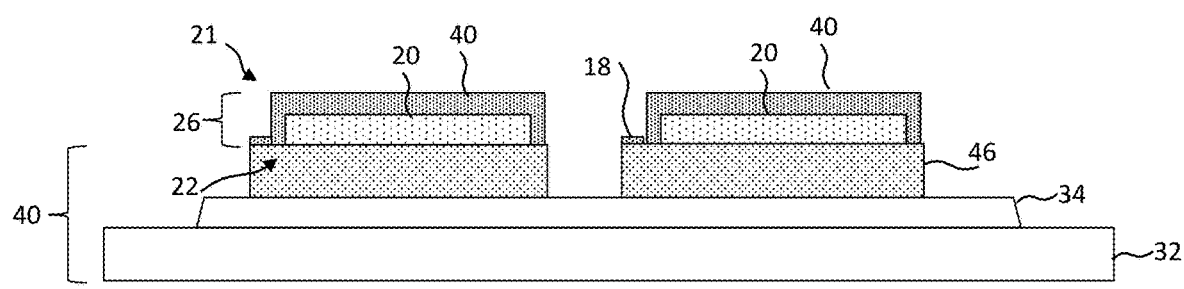
FIG. 9 is a cross section illustrating components adhered to a second stamp according to illustrative embodiments of the present disclosure.
Figure 16:
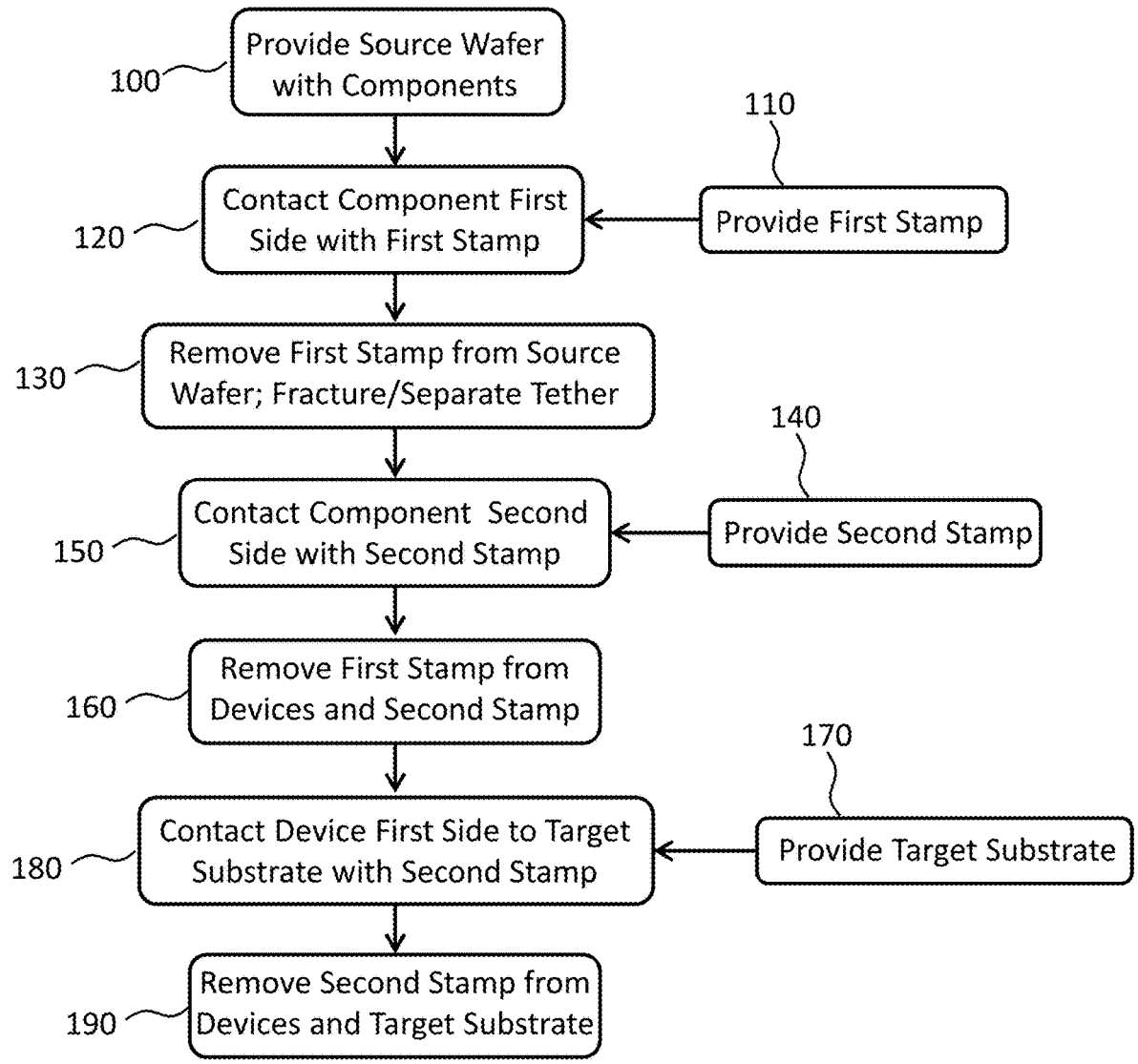
FIG. 16 is a flow diagram according to illustrative methods of the present disclosure.

FIGS. 6-11 and flow diagram FIG. 16 sequentially illustrate the process of micro-transfer printing components 20, according to some embodiments of the present disclosure. As shown in FIG. 6, a source wafer 10 with components 20 on substrate 10 is provided in step 100, a first stamp 30 is provided in step 110, and first sides 21 of components 20 are contacted with stamp posts 36 of first stamp 30 in step 120. As shown in FIG. 7, in step 130 first stamp 30 is removed from substrate 10, fracturing or separating tethers 18 connecting components 20 to anchors 16 of substrate 10 and adhering components 20 to stamp posts 36. In step 140 and as shown in FIG. 8, second stamp 40 is provided and, in step 150, second posts 46 contact second sides 22 of components 20. Fewer second posts 46 can contact components 20 than first posts 36, second posts 46 can be larger or more adhesive than first posts 36, and a greater second post area can contact component 20 than a first post area. As shown in FIG. 9, in step 160 first stamp 30 is removed, leaving components 20 adhered to second stamp posts 46 of second stamp 40.

Figure 10:
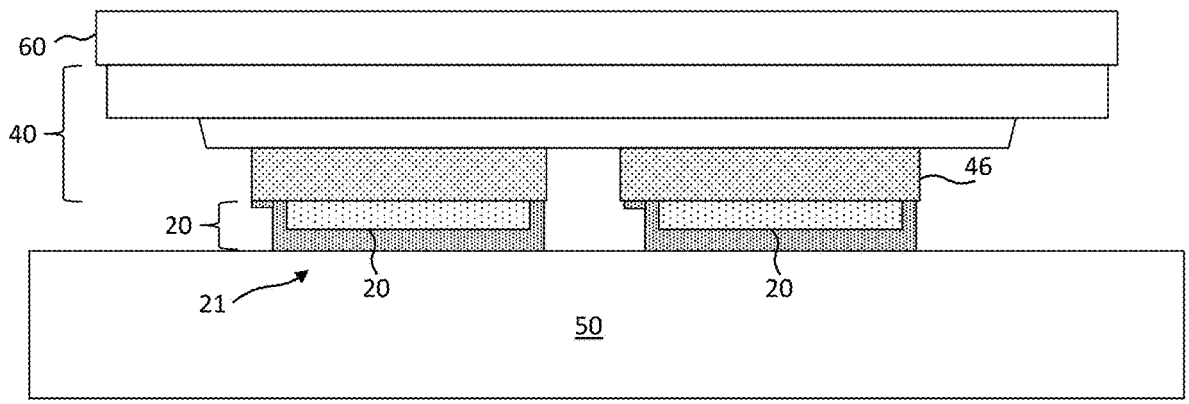
FIG. 10 is a cross section illustrating a second stamp printing adhered components to a target substrate according to illustrative embodiments of the present disclosure.
Figure 11:
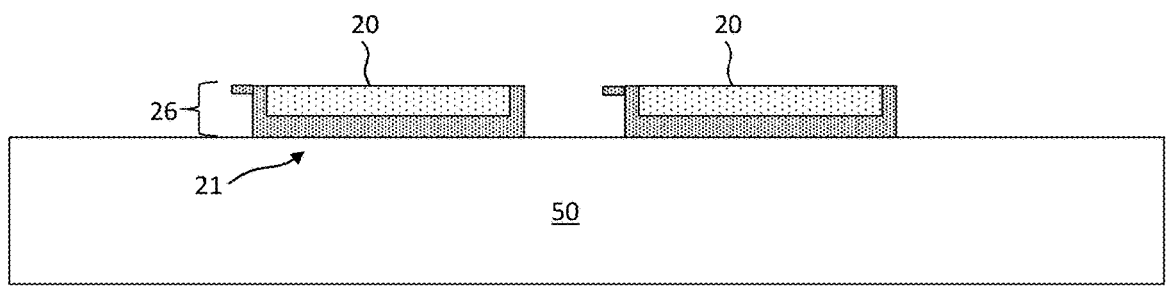
FIG. 11 is a cross section illustrating components printed to a target substrate according to illustrative embodiments of the present disclosure.

A target substrate 50 is provided in step 170, as shown in FIG. 10, and a motion platform 60 contacts first sides 21 of components 20 on second posts 46 to target substrate 50 in step 180. Second stamp 40 is then removed in step 190, leaving components 20 adhered to target substrate 50, as shown in FIG. 11.

Figure 12A:
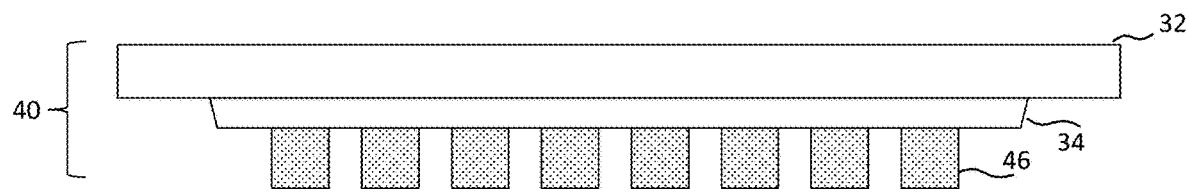
FIG. 12A is a cross section illustrating a second stamp according to illustrative embodiments of the present disclosure.
Figure 12B:
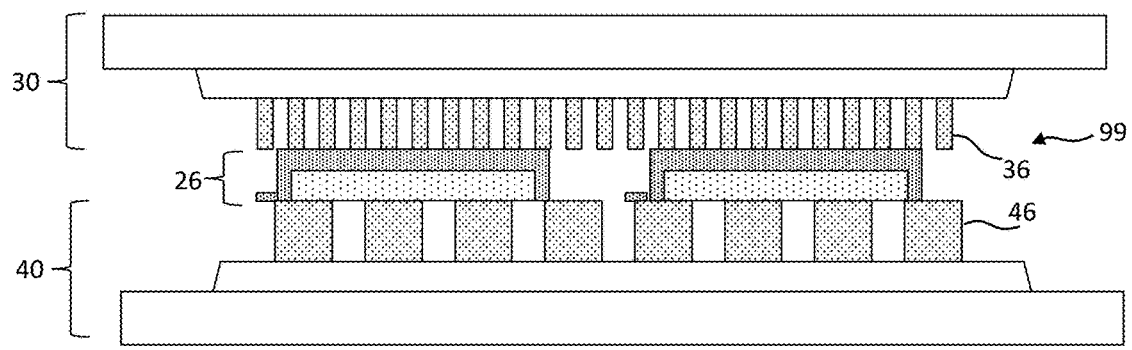
FIG. 12B is a cross section illustrating a stamp-to-stamp transfer of components from a first stamp to the second stamp of FIG. 12A according to illustrative embodiments of the present disclosure.
Figure 12C:
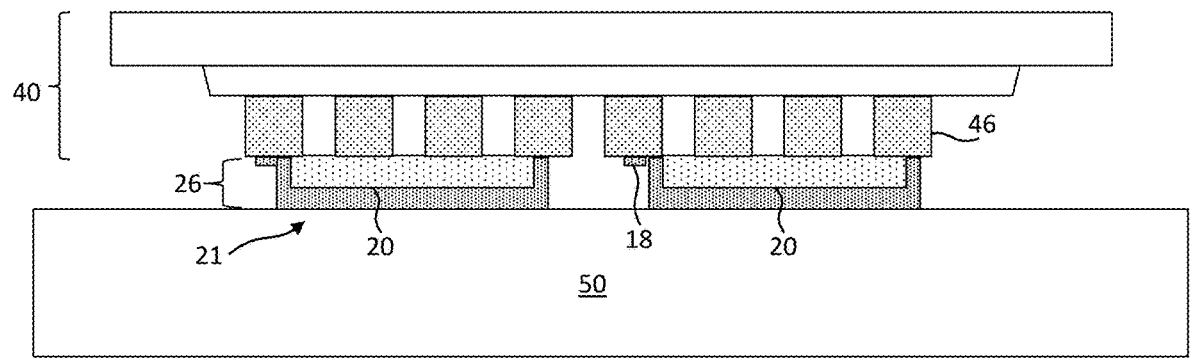
FIG. 12C is a cross section illustrating micro-transfer printing components adhered to the second stamp of FIG. 12A to a target substrate according to illustrative embodiments of the present disclosure.
Figure 12D:
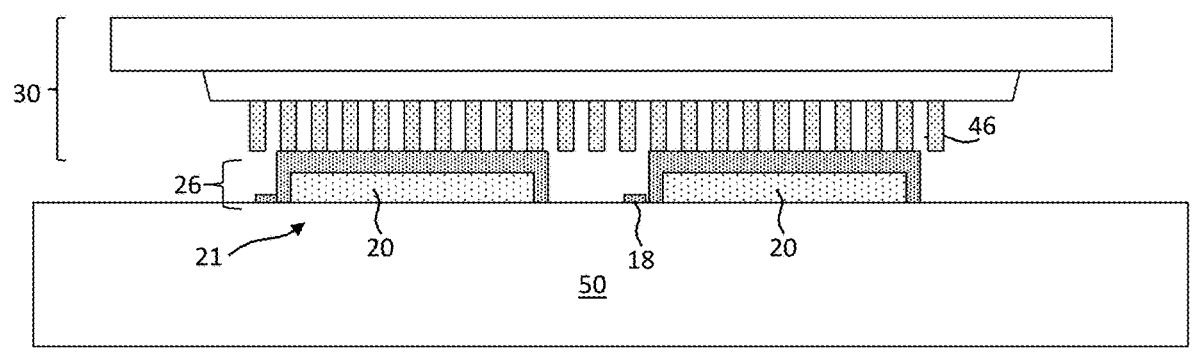
FIG. 12D is a cross section illustrating directly micro-transfer printing components adhered to the first stamp of FIG. 3 to a target substrate according to illustrative embodiments of the present disclosure.

In some embodiments of the present disclosure and as shown in FIG. 12A, second stamp 40 provides multiple second posts 46 in contact with components 20, but fewer second posts 46 in contact with components 20 than first posts 36 of first stamp 30, as illustrated in FIG. 12B. The second post area in contact with component 20 is larger than the first post area in contact with component 20, even though there are fewer second posts 46 than first posts 36 in contact with component 20. FIG. 12B illustrates a stamp-to-stamp transfer using first and second stamps 30, 40 of FIG. 3 and FIG. 12A, respectively. FIG. 12C illustrates printing from second stamp 40 of FIG. 12A to target substrate 50 so that components 20 are adhered to target substrate 50 in a flipped (inverted) configuration. In some embodiments, components 20 are printed directly from first stamp 30 to target substrate 50. In some such embodiments, components 20 are not micro-transfer printed in a flipped configuration, as shown in FIG. 12D with first stamp 30.

Figure 13:
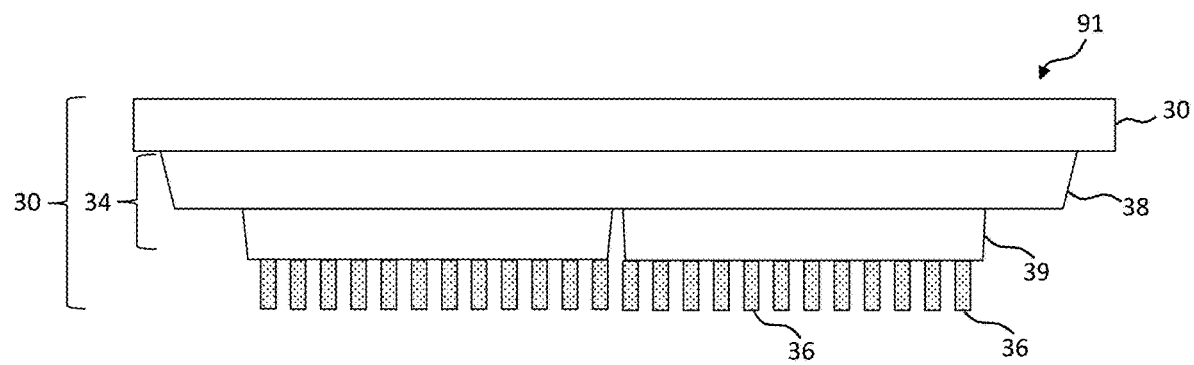
FIG. 13 is a cross section illustrating a first stamp with pedestals according to illustrative embodiments of the present disclosure.
Figure 14:
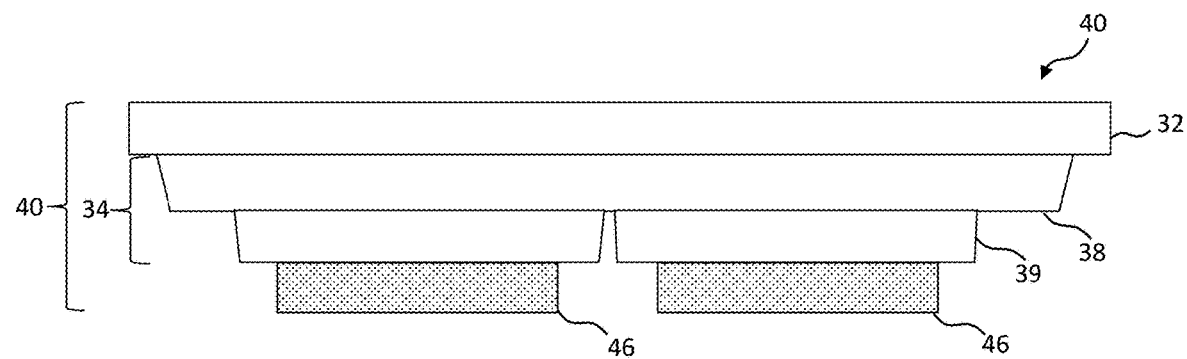
FIG. 14 is a cross section illustrating a second stamp with pedestals according to illustrative embodiments of the present disclosure.

According to some embodiments and as shown in FIGS. 13 and 14, bulk layer 34 of first stamp 30 or of second stamp 40, or both, can comprise a common layer 38 and one or more pedestals 39. Common layer 38 is disposed on rigid support 32 and pedestals 39 are disposed on common layer 38 on a side of common layer 38 opposite rigid support 32. Two or more posts 36 are disposed on each pedestal 39 of the one or more pedestals 39. Pedestal 39 is at least as flexible as common layer 38. In some embodiments, pedestal 39 is more flexible than common layer 38. The use of pedestals 39 on a common layer 38 can improve accuracy by decreasing runout due to curing the stamp material at a temperature greater than the temperature at which stamps 30 are used.

Figure 12E:
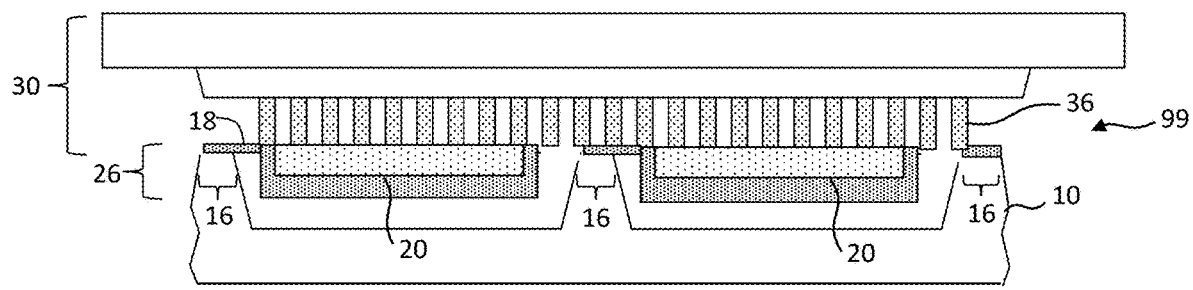
FIG. 12E is a cross section illustrating micro-transfer printing components with a first stamp from a handle substrate in flipped configuration according to illustrative embodiments of the present disclosure.

Stamps 30 of the present disclosure provide an advantage in that they operate to pick up components 20 without requiring careful alignment with a component 20 source substrate 10, since posts 36 can contact components 20 regardless of the relative orientation and position of stamp 30 and substrate 10. Moreover, by employing a first stamp 30 with posts 36 with a relatively smaller surface area in contact with components 20, components 20 can be transferred to a second stamp 40 with fewer, larger second posts 46 with a relatively greater area in contact with components 20, enabling printing components 20 on a target substrate 50 in a flipped configuration. Again, in some embodiments, relatively smaller posts 36 on a second stamp 40 can be used to transfer components 20 to second stamp 40 from first stamp 30 without requiring careful alignment of first stamp 30 and second stamp 40. In some embodiments, substrate 10 (source wafer 10) can be provided as a flip-chip wafer with components 20 adhered to a handle substrate and stamps 30 of the present disclosure can micro-transfer print components 20 from the handle substrate to a target substrate 50, either directly in a flipped configuration, or indirectly with a second stamp 40 that disposes components 20 in a conventional, non-flipped configuration. Some such embodiments are useful when it is difficult to form a sacrificial layer 12 in or on native source wafer 10 on which components 20 are constructed. Components 20 can then be adhered to the handle wafer, native source wafer 10 removed, e.g., by grinding or laser lift-off, leaving components 20 adhered to the handle wafer in a flipped configuration, e.g., as shown in FIG. 12E, and then printed in a normal configuration with first and second stamps 30, 40, as described above by flipping components 20 a second time, or directly in a flipped configuration from the handle substrate with only one first stamp 30.

Substrate 10 can be a source wafer 10 (e.g., a component source wafer 10 or native component source wafer 10) and each component 20 can be disposed completely and entirely over a sacrificial portion 14. In certain embodiments, source wafer 10 (substrate 10) can be any structure with a surface suitable for forming patterned sacrificial layers 12, sacrificial portions 14 (or etched gap 15), anchors 16, tethers 18, and disposing or forming patterned components 20. For example, source wafers 10 can comprise a semiconductor or compound semiconductor and can comprise an etchable sacrificial layer 12 comprising material different (e.g., an oxide) from material of source wafer 10. Any one or more of source wafer 10, sacrificial layer 12, and sacrificial portion 14 can comprise an anisotropically etchable material. Suitable semiconductor materials can be silicon or silicon with a (100) crystal structure (e.g., orientation). A surface of source wafer 10 can be substantially planar and suitable for photolithographic processing, for example as found in the integrated circuit or MEMs art.

In some embodiments of the present disclosure, components 20 are small integrated circuits or micro-electromechanical (MEMS) devices, for example chiplets (e.g., micro-chiplets). Component 20 can have any suitable aspect ratio or size in any dimension and any useful shape, for example a rectangular cross section or rectangular top or rectangular bottom surface. Components 20 can be micro-components, for example having at least one dimension that is in the micron range, for example having a planar extent from 2 microns by 5 microns to 200 microns by 500 microns (e.g., an extent of 2 microns by 5 microns, 20 microns by 50 microns, or 200 microns by 500 microns) and, optionally, a thickness of from 200 nm to 200 microns (e.g., at least or no more than 2 microns, 20 microns, or 200 microns). Components 20 can have a thin substrate with at least one of (i) a thickness of only a few microns, for example less than or equal to 25 microns, less than or equal to 15 microns, or less than or equal to 10 microns, (ii) a width of 5-1000 microns (e.g., 5-10 microns, 10-50 microns, 50-100 microns, or 100-1000 microns) and (iii) a length of 5-1000 microns (e.g., 5-10 microns, 10-50 microns, 50-100 microns, or 100-1000 microns).

Such micro-components 20 can be made in a native source semiconductor wafer (e.g., a silicon wafer) having a process side and a back side used to handle and transport the wafer using lithographic processes. Components 20 can be formed using lithographic processes in an active layer on or in the process side of source wafer 10. Methods of forming such structures are described, for example, in U.S. Pat. No. 8,889,485. According to some embodiments of the present disclosure, source wafers 10 can be provided with components 20, sacrificial layer 12 (a release layer), sacrificial portions 14, and tethers 18 already formed, or they can be constructed as part of a process in accordance with certain embodiments of the present disclosure.

In certain embodiments, components 20 can be constructed using foundry fabrication processes used in the art. Layers of materials can be used, including materials such as metals, oxides, nitrides and other materials used in the integrated-circuit art. Components 20 can have different sizes, for example, less than 1000 square microns or less than 10,000 square microns, less than 100,000 square microns, or less than 1 square mm, or larger. Components 20 can have, for example, at least one of a length, a width, and a thickness of no more than 500 microns (e.g., no more than 250 microns, no more than 100 microns, no more than 50 microns, no more than 25 microns, or no more than 10 microns). Components 20 can have variable aspect ratios, for example at least 1:1, at least 2:1, at least 5:1, or at least 10:1. Components 20 can be rectangular or can have other shapes.

A component 20 can be an active circuit component, for example including one or more active electronic components such as electronic transistors or diodes or light-emitting diodes or photodiodes that produce an electrical current in response to ambient light. A component 20 can be a passive component, for example including one or more passive elements such as resistors, capacitors, or conductors. In some embodiments, a component 20 includes both active and passive elements. A component 20 can be a semiconductor device having one or more semiconductor layers, such as an integrated circuit. A component 20 can be an unpackaged die. In some embodiments, a component 20 is a compound device 20 having a plurality of active or passive elements, such as multiple semiconductor components with separate substrates, each with one or more active elements or passive elements, or both. Components 20 can be or include, for example, electronic processors, controllers, drivers, light-emitting diodes, photodiodes, light-control devices, light-management devices, piezoelectric devices, acoustic wave devices (e.g., acoustic wave filters), optoelectronic devices, electromechanical devices (e.g., microelectromechanical devices), photovoltaic devices, sensor devices, photonic devices, magnetic devices (e.g., memory devices), or elements thereof.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST 10 substrate/source wafer
12 sacrificial layer
14 sacrificial portion/sacrificial material
15 gap
16 anchor
18 tether
20 component
21 first side
22 second side
24 encapsulation layer
26 component structure
28 component edge/component side
30 stamp/first stamp
32 rigid support
34 bulk layer
36 post/first post
38 common layer
39 pedestal
40 second stamp
46 second post
50 target substrate
60 motion platform
99 micro-transfer structure
100 provide source wafer with components step
110 provide first stamp step
120 contact component first side with first stamp step
130 remove first stamp from source wafer step
140 provide second stamp step
150 contact component second side with second stamp step
160 remove first stamp from component and second stamp step
170 provide target substrate step
180 contact component first side to target substrate step
190 remove second stamp from components and target substrate step

The invention claimed is:

1. A micro-transfer structure, comprising:
a first stamp comprising a rigid support, an elastomeric bulk layer disposed on the rigid support, and first elastomeric posts disposed on the bulk layer; and
components each having a first side and an opposing second side, wherein the components are adhered to some but not all of the first posts on the first sides of the component, wherein each of the components is adhered to two or more of the first posts; and
a second stamp different from the first stamp, the second stamp comprising a second rigid support, a second elastomeric bulk layer disposed on the second rigid support, and second posts disposed on the second elastomeric bulk layer, wherein the second sides of the components are adhered to the second stamp, and wherein each component of the components is adhered to fewer second posts of the second stamp than first posts of the first stamp.

2. The micro-transfer structure of claim 1, wherein only one second post is adhered to each of the components.

3. The micro-transfer structure of claim 2, wherein not all of the second posts are adhered to the components.

4. The micro-transfer structure of claim 1, wherein each first post of the first posts has a distal end with a first post area, each second post of the second posts has a distal end with a second post area, and the second post area of each of the second posts is greater than the first post area of each of the first posts.

5. The micro-transfer structure of claim 4, wherein, for each of the components, the sum of the first post areas of the first posts in contact with the component is smaller than the sum of the second post areas of the second posts in contact with the component.

6. The micro-transfer structure of claim 1, comprising a motion platform and the first rigid support is in contact with and controlled by the motion platform and the second rigid support is in contact with and controlled by the motion platform.

7. The micro-transfer structure of claim 1, wherein the second posts have a greater adhesion to the components than the first posts.

8. A method of making a micro-transfer printed structure, comprising:
providing a source wafer with components disposed in, on, or over the source wafer;
providing a stamp comprising a rigid support, an elastomeric bulk layer disposed on the rigid support, and posts disposed on the bulk layer, wherein the rigid support is less flexible than the bulk layer;
contacting the stamp to the components without first aligning the stamp to the source wafer such that some but not all of the posts adhere to the components and two or more of the posts adhere to each of the components; and
removing the components from the source substrate by separating the stamp from the source wafer such that the components remain adhered to the stamp.

9. A method of making a micro-transfer printed structure, comprising:
providing a source wafer with components disposed in, on, or over the source wafer;
providing a first stamp comprising a rigid support, an elastomeric bulk layer disposed on the rigid support, and first posts disposed on the bulk layer;
contacting the first posts to the components thereby adhering the first posts to the components, wherein two or more of the first posts are adhered to each of the components; and
removing the first stamp with the components adhered from the source substrate,
providing a second stamp different from the first stamp, the second stamp comprising a second rigid support, a second elastomeric bulk layer disposed on the second rigid support, and second posts disposed on the second bulk layer, and
contacting the second posts to the components on a side of the components opposite the first posts thereby adhering the components to the second stamp while the components are adhered to the first stamp, wherein, for each of the components, fewer of the second posts are adhered to the component than first posts are adhered to the component and the area of the second posts adhered to the component is greater than the area of the first posts adhered to the component.

10. The method of claim 9, comprising removing the first stamp, contacting the components to a target substrate with the second stamp, and removing the second stamp from the components, thereby disposing the components on the target substrate.

11. A micro-transfer structure, comprising:
a stamp comprising a rigid support and posts disposed on or over the rigid support; and
components adhered to some but not all of the posts, and wherein each of the components is adhered to two or more of the posts, at least some of the posts are not in contact with any component, and at least one pair of adjacent ones of the components are separated by a distance that is smaller than a length, a width, or both a length and a width of either of the adjacent ones of the components with at least one of the posts on which no component is adhered disposed therebetween.

12. The micro-transfer structure of claim 11, wherein relative orientation or position of the components with respect to the posts is different for different components.

13. The micro-transfer structure of claim 11, wherein each post has (i) a substantially planar distal end, (ii) a contiguous distal end, or (iii) both (i) and (ii).

14. The micro-transfer structure of claim 11, comprising a source substrate, wherein the components are disposed on the source substrate.

15. The micro-transfer structure of claim 11, comprising a target substrate, wherein the components are disposed on the target substrate.

16. The micro-transfer structure of claim 11, comprising a motion platform, wherein the rigid support is in contact with and controlled by the motion platform.

17. The micro-transfer structure of claim 11, wherein each of the components is adhered to at least six of the posts.

18. The micro-transfer structure of claim 11, wherein the posts are arranged in rows and columns, each of the components has an edge, and the edge is aligned with a row of the rows or a column of the columns.

19. The micro-transfer structure of claim 11, wherein each post of the posts has a distal end with a post area, each component has a component area, and the post area is less than one half of the component area.

20. The micro-transfer structure of claim 11, wherein each of the posts has a contact surface disposed in a common plane.

21. The micro-transfer structure of claim 11, wherein the posts are not aligned to the components.

22. The micro-transfer structure of claim 14, wherein the stamp is not aligned to the source substrate.

23. The method of claim 8, wherein relative orientation or position of the components with respect to the posts is different for different components.

24. The method of claim 8, comprising printing the component from the stamp to a target substrate by contacting the components to the target substrate with the stamp and separating the stamp from the components while the components remain disposed on the target substrate.

25. The method of claim 9, wherein (i) some but not all of the first posts are adhered to the components and two or more of the first posts are adhered to each of the components while the components are adhered to the first stamp and (ii) some but not all of the second posts are adhered to the components and two or more of the second posts are adhered to each of the components while the components are adhered to the second stamp.

26. The structure of claim 11, wherein each pair of adjacent ones of the components has ones of the posts to which no component is adhered distributed therebetween.

27. The structure of claim 11, wherein the posts are disposed in a regular array and ones of the posts to which no component is adhered are distributed throughout the regular array between adjacent ones of the components.

28. The structure of claim 11, wherein relative orientation or position of the components with respect to the posts is different for different components.

29. The structure of claim 11, wherein the length, the width, or both the length and the width is no more than 1000 microns.

30. The structure of claim 11, wherein the length, the width, or both the length and the width is no more than 250 microns.

31. The structure of claim 1, wherein more than one of the second posts is adhered to each of the components.

32. The structure of claim 31, wherein not all of the second posts are adhered to the components.

33. The micro-transfer structure of claim 11, wherein the stamp comprises an elastomeric bulk layer disposed on the rigid support, the posts are elastomeric posts disposed on the bulk layer, and the rigid support is less flexible than the bulk layer.

34. The micro-transfer structure of claim 33, wherein the bulk layer comprises a single contiguous common layer disposed on the rigid support and one or more pedestals disposed on the common layer on a side of the common layer opposite the rigid support, wherein two or more posts are disposed on each of the one or more pedestals.

35. The micro-transfer structure of claim 34, wherein the pedestals are at least as flexible as the common layer.

36. The micro-transfer structure of claim 33, wherein the bulk layer and the posts are more flexible than the rigid support.

37. The micro-transfer structure of claim 33, wherein the elastomeric bulk layer is a single, contiguous layer, the stamp comprises no other bulk layer than the elastomeric bulk layer, and the posts are disposed directly on and in contact with the elastomeric bulk layer.

38. The micro-transfer structure of claim 33, wherein the posts are substantially identical and are disposed in a regular array on the bulk layer.

* * * * *